United States Patent
Thibault (10) Patent No.: US 11,747,186 B2
(45) Date of Patent: Sep. 5, 2023

(54) DEVICE FOR CAPACITIVE MEASUREMENTS IN A MULTI-PHASE MEDIUM

(71) Applicant: UNIVERSITE GRENOBLE ALPES, Saint-Martin d'Heres (FR)

(72) Inventor: Pierre Thibault, Saint Martin d'Uriage (FR)

(73) Assignee: UNIVERSITE GRENOBLE ALPES, Saint-Martin d'Heres (FR)

( * ) Notice: Subject to any disclaimer, the term of this patent is extended or adjusted under 35 U.S.C. 154(b) by 191 days.

(21) Appl. No.: 16/961,351

(22) PCT Filed: Jan. 8, 2019

(86) PCT No.: PCT/FR2019/050033
§ 371 (c)(1),
(2) Date: Jul. 10, 2020

(87) PCT Pub. No.: WO2019/138181
PCT Pub. Date: Jul. 18, 2019

(65) Prior Publication Data
US 2020/0340844 A1     Oct. 29, 2020

(30) Foreign Application Priority Data
Jan. 12, 2018   (FR) .................................. 1850268

(51) Int. Cl.
*G01F 23/263*    (2022.01)
*G01D 5/24*      (2006.01)
*G01R 27/26*     (2006.01)

(52) U.S. Cl.
CPC ......... *G01F 23/266* (2013.01); *G01D 5/2405* (2013.01); *G01R 27/2605* (2013.01)

(58) Field of Classification Search
CPC ... G01F 23/266; G01F 23/263; G01D 5/2405; G01R 27/2605
See application file for complete search history.

(56) References Cited

U.S. PATENT DOCUMENTS

| | | | |
|---|---|---|---|
| 4,413,810 A | 11/1983 | Tenberg et al. | |
| 5,543,717 A * | 8/1996 | Kordas | G01R 27/22 324/715 |

(Continued)

FOREIGN PATENT DOCUMENTS

| | | | |
|---|---|---|---|
| EP | 3246667 A1 | 11/2017 | |
| JP | 2000065775 A * | 3/2000 | ............. G01N 27/22 |
| JP | 2000065775 A | 3/2000 | |

OTHER PUBLICATIONS

International Search Report for International Application No. PCT/FR2019/050033, dated May 9, 2019, 5 pages (including English translation).

(Continued)

*Primary Examiner* — Giovanni Astacio-Oquendo
*Assistant Examiner* — Dilara Sultana
(74) *Attorney, Agent, or Firm* — TraskBritt (57) ABSTRACT

A device comprises at least one pair of excitation electrodes forming a capacitor; a floorplan (e.g., a ground plane); and an electronic circuit. The device comprises at least one control electrode arranged at a distance from the capacitor. A switching circuit, of the device, comprises a switch having an open state and a closed state. The switching circuit is designed to apply, to the control electrode, an electric potential common to the floorplan when the switch is in the closed state. The switching circuit is also designed to leave a floating electrical potential for the control electrode when the switch is in the open state. The electronic circuit is designed to measure the mutual capacitance between the (Continued)

pair of excitation electrodes when the switch is in the open state and when it is in the closed state.

12 Claims, 5 Drawing Sheets

(56) References Cited

U.S. PATENT DOCUMENTS

| | | | |
|---|---|---|---|
| 6,433,560 B1 | 8/2002 | Hansen et al. | |
| 7,258,005 B2 | 8/2007 | Nyce | |
| 9,383,330 B2* | 7/2016 | Schleicher | G01N 27/221 |
| 10,027,322 B2* | 7/2018 | Jiao | G01D 5/24 |
| 2010/0259416 A1* | 10/2010 | Levy | G01F 23/268 |
| | | | 340/856.3 |
| 2017/0336242 A1* | 11/2017 | Thibault | G01F 23/268 |

OTHER PUBLICATIONS

International Written Opinion for International Application No. PCT/FR2019/050033, dated May 9, 2019, 9 pages (including English machine translation).

\* cited by examiner

DEVICE FOR CAPACITIVE MEASUREMENTS IN A MULTI-PHASE MEDIUM

CROSS-REFERENCE TO RELATED APPLICATIONS

This application is a national phase entry under 35 U.S.C. § 371 of International Patent Application PCT/FR2019/050033, filed Jan. 8, 2019, designating the United States of America and published as International Patent Publication WO 2019/138181 A1 on Jul. 18, 2019, which claims the benefit under Article 8 of the Patent Cooperation Treaty to French Patent Application Serial No. 1850268, filed Jan. 12, 2018.

TECHNICAL FIELD

The present disclosure relates to the technical field of devices for taking capacitive measurements of a multiphase medium, the multiphase medium containing fluid phases that differ in their dielectric properties, for example an aqueous phase and at least one organic phase.

Devices for taking capacitive measurements have the advantage of being able to operate at a single working frequency, contrary to devices for taking impedance measurements (e.g., by electrochemical impedance spectroscopy), which require a complete scan of the frequencies in question.

The present disclosure is notably applicable to:
- detecting the presence of an aqueous phase within a multiphase medium containing at least one organic phase (e.g., oil, kerosene, fuel oil, etc.),
- determining the height of the aqueous phase in a vessel containing a multiphase medium containing at least one organic phase (e.g., oil, kerosene, fuel oil, etc.),
- determining the height of sedimented or floating layers in a phase separator (e.g., sludges, fats, etc.), and
- monitoring drying of a porous multiphase medium (e.g., concrete, wet earth, etc.).

BACKGROUND

One device for taking capacitive measurements that is known in the prior art, and notably from document U.S. Pat. No. 7,258,005, comprises:
- at least one pair of excitation electrodes, forming a capacitor, and intended to be inserted into the multiphase medium;
- a ground plane;
- an electronic circuit, arranged to electrically connect the pair of excitation electrodes to the ground plane, and configured to:
apply an electrical potential to each excitation electrode at a working frequency, and measure a transcapacitance between the pair of excitation electrodes.

This prior-art device is not entirely satisfactory in so far as it requires a particular geometric arrangement of the excitation electrodes, and, in particular, the spacing therebetween to be larger than or equal to two times the thickness of the dielectric walls of a vessel containing the multiphase medium (see claim 1; column 5, lines 21-25; column 6, lines 4-5). If the spacing between the excitation electrodes is smaller than two times the thickness of the dielectric walls of the vessel, the dependence of the value of the transcapacitance on the height of the fluid decreases (see column 6, lines 7-8) and hence the sensitivity and accuracy of the measurement decreases.

BRIEF SUMMARY

The present disclosure aims to completely or partially remedy the aforementioned drawbacks. To this end, one subject of the present disclosure is a device for taking capacitive measurements in a multiphase medium, comprising:
at least one pair of excitation electrodes, forming a capacitor;
a ground plane; and
an electronic circuit, arranged to electrically connect the pair of excitation electrodes to the ground plane, and configured to:
apply an electrical potential to each excitation electrode at a working frequency, and measure a transcapacitance between the pair of excitation electrodes;
the device being noteworthy in that it comprises:
at least one control electrode, arranged at a distance from the capacitor, and intended to be inserted into the multiphase medium; and
a switching circuit comprising a switch having an open state and a closed state, in which states the switch electrically disconnects and connects the control electrode from/to the ground plane, respectively, the switching circuit being configured to:
apply, to the control electrode, an electrical potential common to the ground plane, when the switch is in the closed state, and
leave the electrical potential of the control electrode floating, when the switch is in the open state; and
in that the electronic circuit is configured to measure the transcapacitance between the pair of excitation electrodes when the switch is in the open state and when the switch is in the closed state.

Thus, such a device according to the present disclosure allows, by virtue of the control electrode, the presence of an electrically conductive phase to be detected at the working frequency provided that the transcapacitance measured when the switch is in the open state is different from the transcapacitance measured when the switch is in the closed state.

Furthermore, such a device according to the present disclosure allows, by virtue of the control electrode, the height of the detected phase in a vessel to be determined on the basis of the transcapacitances measured when the switch is in the open state and in the closed state.

Lastly, the operation of such a device according to the present disclosure places no specific constraints on the spacing between excitation electrodes, contrary to the prior art.

Definitions

By "multiphase medium," what is meant is a medium containing phases that differ in their dielectric properties. The phases are not necessarily immiscible. The multiphase medium may contain fluid phases and/or solid phases, for example, when the multiphase medium is porous.

By "ground plane," what is meant is any means for obtaining a reference potential for the device.

By "transcapacitance," what is meant is the electrical capacitance between the pair of excitation electrodes, i.e., the ratio between the amount of electrical charge borne by one excitation electrode and the potential difference between the two excitation electrodes. The transcapacitance therefore differs from the electrical capacitance between either of the excitation electrodes and the ground plane.

The device according to the present disclosure may comprise one or more of the following features.

According to one feature of embodiments of the present disclosure, the multiphase medium comprises a phase containing species that are electrically conductive at the working frequency; the species possessing a cut-off frequency, below which the species equalize the electrical potential, left floating, in the multiphase medium, over the distance at which is arranged the control electrode of the capacitor; and the working frequency is chosen so as to be lower than or equal to the cut-off frequency.

By "equalize" what is meant is:
either a strict equalization of the electrical potential, left floating, in the multiphase medium, over the distance at which is arranged the control electrode of the capacitor; or
an approximate equalization of the electrical potential, left floating, in the multiphase medium, over the distance at which is arranged the control electrode of the capacitor, so that the potential difference between the electrically conductive phase (at the working frequency) and the control electrode remains negligible.

One advantageous effect thereof is to improve the reliability of the device in case of detection of phase presence, and to improve the accuracy of the measurement in case of determination of the height of the phase in a vessel, for example.

According to one feature of embodiments of the present disclosure, the capacitor has a characteristic distance, denoted d; and
the distance at which is arranged the control electrode of the capacitor, which distance is denoted l, is chosen so that:

$$0 < l < 100 \times d \frac{f_c}{f} \text{ and preferably}$$

$$0 < l < 10 \times d \frac{f_c}{f}$$

where:
$f_c$ is the cut-off frequency, and
f is the working frequency.

Thus, a large distance l (i.e., close to 100 d $f_c/f$) may be chosen provided that the electronic circuit has a very high level of performance in terms of the accuracy of the measurement of the transcapacitance between the pair of excitation electrodes. Conversely, a smaller distance l (i.e., of as little as 10 d $f_c/f$) will be chosen if the electronic circuit possesses a conventional level of performance in terms of the accuracy of the measurement of the transcapacitance between the pair of excitation electrodes.

According to one feature of embodiments of the present disclosure, the device comprises a set of control electrodes, these electrodes being arranged at various distances from the capacitor and being intended to be inserted into the multiphase medium, the switching circuit comprising one dedicated switch for each control electrode.

One advantageous effect thereof is to allow, within the multiphase medium, the presence or amount of the electrically conductive phase to be studied spatially at the working frequency. By way of example, it is then possible to monitor the drying state of a porous and moist multiphase medium.

According to one feature of embodiments of the present disclosure, the electronic circuit comprises a virtual ground connected to an excitation electrode, and the electronic circuit is configured to measure the transcapacitance between the pair of excitation electrodes using a three- or four-wire method.

One advantageous effect of the virtual ground, and of the three- or four-wire method, is to make it possible to allow for parasitic capacitances between an excitation electrode and the ground plane, as well as the impedance of a wire, so as to obtain an accurate measurement of the transcapacitance between the pair of excitation electrodes.

According to one feature of embodiments of the present disclosure, the electronic circuit comprises an operational amplifier used as an inverter, and comprising:
a non-inverting input, connected to the ground plane; and
an inverting input, connected to an excitation electrode.

One advantageous effect thereof is to make it easy to obtain a virtual ground. In other words, such a use allows the excitation electrode connected to the inverting input to be placed virtually at ground potential, when the operational amplifier is employed in the linear regime.

According to one feature of embodiments of the present disclosure, the device comprises:
a dielectric layer, comprising a first surface and an opposite second surface, the pair of excitation electrodes extending to the first surface of the dielectric layer; and
a counter-electrode, extending to the second surface of the dielectric layer, and forming the ground plane.

One advantageous effect thereof is to allow the assembly formed by the pair of excitation electrodes, the dielectric layer, and the counter-electrode to be inserted into the multiphase medium. The dielectric layer allows the pair of excitation electrodes and the counter-electrode to be electrically insulated from each another.

According to one feature of embodiments of the present disclosure, the pair of excitation electrodes is covered with a dielectric film.

One advantageous effect thereof is to protect the pair of excitation electrodes from the multiphase medium.

According to one feature of embodiments of the present disclosure, the capacitor formed by the pair of excitation electrodes is selected from a parallel-plate capacitor, a capacitor with interdigitated electrodes, and a coaxial-cylinder capacitor.

One advantageous effect of the capacitor with interdigitated electrodes is to inhibit to a lesser extent the movement of the electrically conductive ions (which is notably inhibited with the parallel-plate and coaxial-cylinder capacitors), this making it possible to more easily reach the electrical potential, left floating, in the multiphase medium, over the distance (l) at which is arranged the control electrode of the capacitor. This floating potential will possibly be obtained using an electrical system possessing a very high impedance with respect to a charge reservoir, such as that of an operational amplifier.

With parallel-plate capacitors, potential gradients have been observed to form in the multiphase medium if the distance l is increased. In other words, a capacitor with interdigitated electrodes allows greater freedom over the distance at which is arranged the control electrode of the capacitor.

Another advantageous effect of a capacitor with interdigitated electrodes is to decrease the effects of electrical double layers at the wall (which effects are notably observed with parallel-plate and coaxial-cylinder capacitors). These effects tend to increase the value of the transcapacitance when the switch is in the open state.

Another subject of the present disclosure is an installation, comprising:
a vessel containing a multiphase medium; and
a device according to the present disclosure, the control electrode being inserted into the multiphase medium.

Another subject of the present disclosure is a system for taking capacitive measurements in a multiphase medium, comprising:
a floating device, intended to float in the multiphase medium; and
at least one device according to the present disclosure, securely fastened to the floating device.

Thus, such a system, according to the present disclosure, allows valid capacitive measurements to be taken when the height of the multiphase medium does not remain constant over time, by allowing a reference height to be set relative to the free surface of the multiphase medium by virtue of the presence of the floating device. It is then possible to accurately determine the height of sedimented or floating layers in a phase separator (e.g., hydrocarbons, light sludges, fats, etc.) such as a sewage treatment plant (or micro-plant). Specifically, in this type of application, the position of the free surface of the top phase of the multiphase medium may vary over time, because of variations in the liquid (water) flow rate and in the amount of floating hydrocarbons. The capacitive measurements delivered by such a system, according to the present disclosure, allow at what moment to act to remove a polluting phase (generally by pumping) to be determined by detecting the polluting phase. Specifically, it is important to be able to plan this type of interventions as they are expensive and missing them may lead to pollution being introduced into the environment. Moreover, the capacitive measurements delivered by such a system, according to the present disclosure, allow only the strictly necessary amount of polluting phase to be removed, as they allow the height of the polluting phase to be monitored.

According to one feature of embodiments of the present disclosure, the floating device comprises a separating wall forming a barrier to the multiphase medium, the wall possessing an internal surface, and the device for taking capacitive measurements is mounted inside the wall, against the internal surface.

BRIEF DESCRIPTION OF THE DRAWINGS

Other features and advantages will become apparent from the detailed description of various embodiments, the description containing examples and references to the appended drawings.

DETAILED DESCRIPTION

For the sake of simplicity, elements that are identical or that perform the same function have been designated with the same references in the various embodiments.

One subject of the present disclosure is a device for taking capacitive measurements in a multiphase medium M, comprising:
at least one pair of excitation electrodes 1, 2, forming a capacitor;
a ground plane PM; and
an electronic circuit 3, arranged to electrically connect the pair of excitation electrodes 1, 2 to the ground plane PM, and configured to:
apply an electrical potential V+, V− to each excitation electrode 1, 2 at a working frequency, and
measure a transcapacitance between the pair of excitation electrodes 1, 2;
the device being noteworthy in that it comprises:
at least one control electrode 4, arranged at a distance l from the capacitor, and intended to be inserted into the multiphase medium M; and
a switching circuit 5 comprising a switch 50 having an open state and a closed state, in which states the switch 50 electrically disconnects and connects the control electrode 4 from/to the ground plane PM, respectively, the switching circuit 5 being configured to:
apply, to the control electrode 4, an electrical potential common to the ground plane PM, when the switch 50 is in the closed state, and
leave the electrical potential of the control electrode 4 floating, when the switch 50 is in the open state; and
in that the electronic circuit 3 is configured to measure the transcapacitance between the pair of excitation electrodes 1, 2 when the switch 50 is in the open state and when the switch 50 is in the closed state.

Multiphase Medium

The multiphase medium M contains species forming phases $P_1$, $P_2$, $P_3$. The species possess a cut-off frequency, below which the species equalize the electrical potential, left floating, in the multiphase medium M, over the distance l at which is arranged the control electrode 4 of the capacitor. It is assumed that one of the species is electrically conductive at the working frequency. By way of example, the working frequency may be set to 1 kHz to detect the presence of an aqueous phase $P_1$. The multiphase medium M sets the electrical potential (left floating by the switch 50) of the control electrode 4 when the switch 50 is in the open state.

Figure 6:
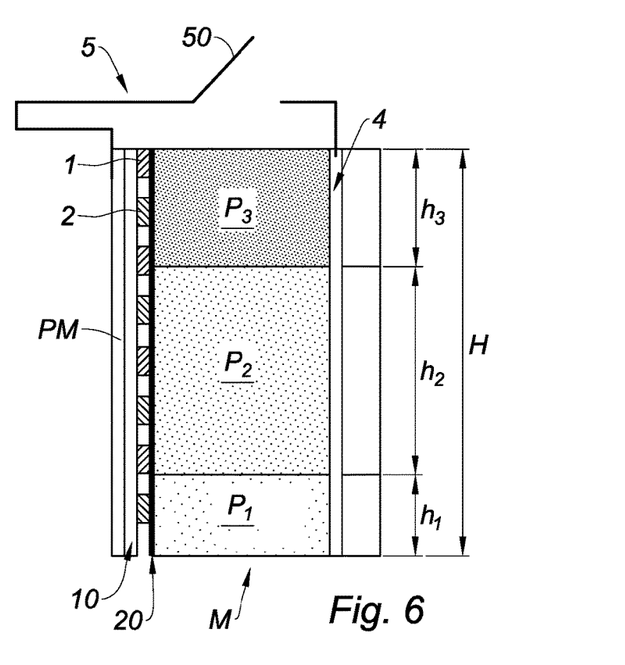
FIG. 6 is a schematic cross-sectional view, illustrating one embodiment of a device according to the present disclosure.

In the case illustrated in FIG. 6, the multiphase medium M contains three phases $P_1$, $P_2$, $P_3$ that are stratified, that differ in their dielectric properties, and that have a height $h_1$, $h_2$, $h_3$ in a vessel R of height H, respectively.

Capacitor

Figure 2:
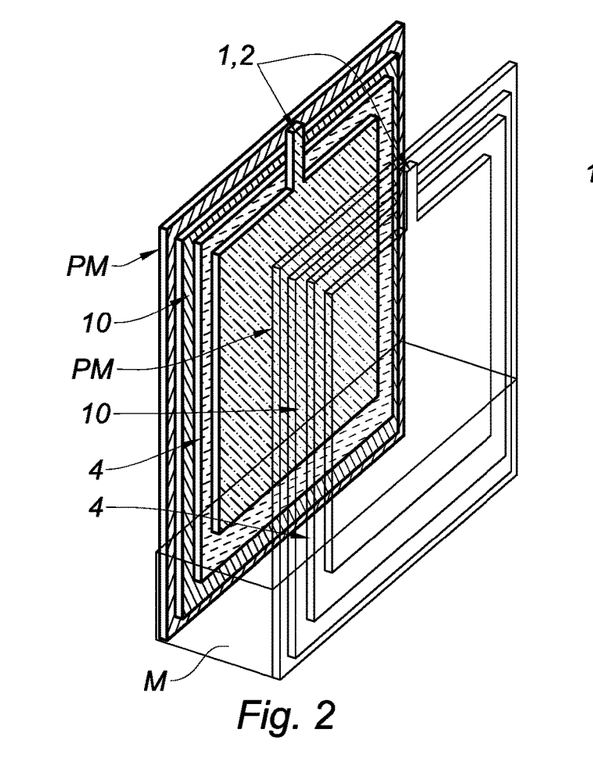
FIG. 2 is a schematic perspective view, illustrating one embodiment of a device according to the present disclosure.
Figure 3:
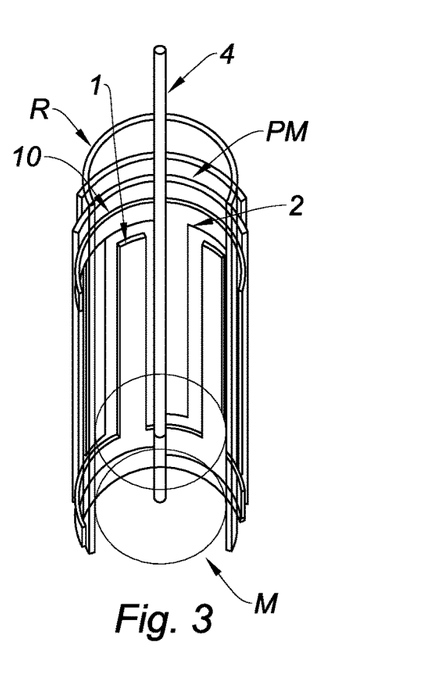
FIG. 3 is a schematic perspective view, illustrating one embodiment of a device according to the present disclosure.
Figure 4:
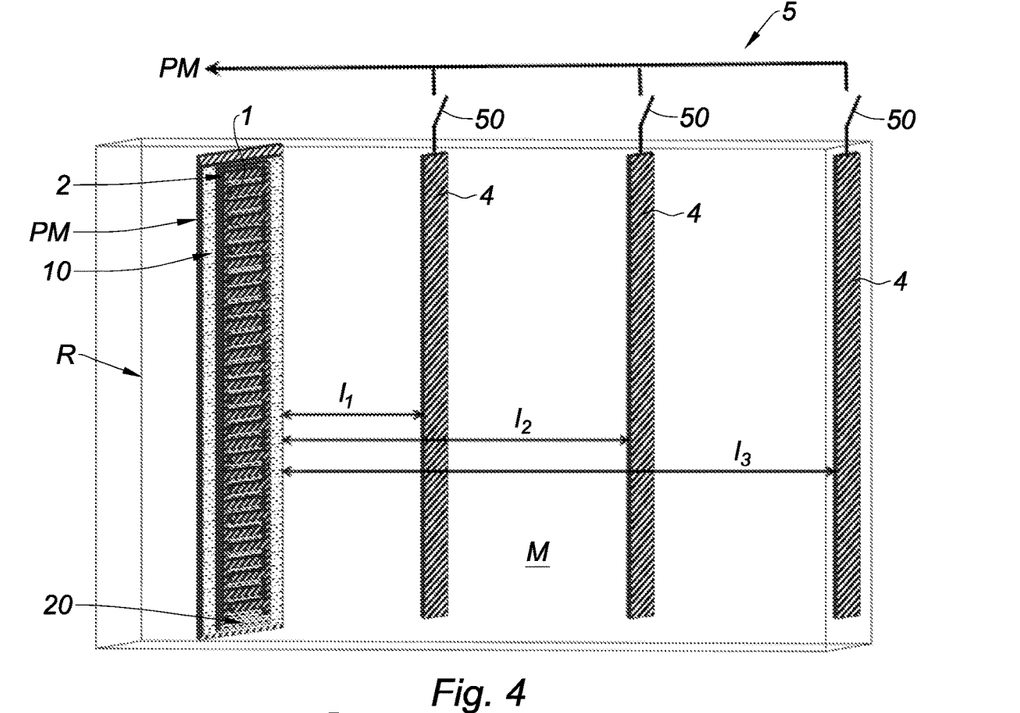
FIG. 4 is a schematic perspective view, illustrating one embodiment of a device according to the present disclosure.
Figure 5:
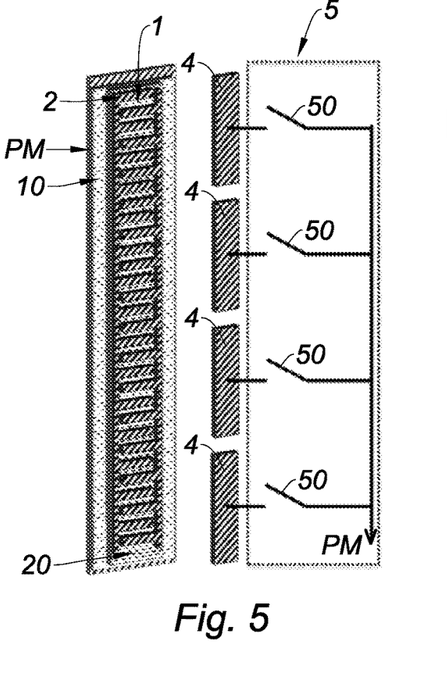
FIG. 5 is a schematic perspective view, illustrating one embodiment of a device according to the present disclosure.

The capacitor formed by the pair of excitation electrodes 1, 2 is advantageously selected from a parallel-plate capacitor (as illustrated in FIG. 2), a capacitor with interdigitated electrodes (as illustrated in FIGS. 4 to 6), and a coaxial-cylinder capacitor (as illustrated in FIG. 3).

The capacitor has a characteristic distance, denoted d. For example, for a parallel-plate capacitor, the characteristic distance d is the distance separating the two plates. For a capacitor with interdigitated electrodes, the characteristic distance d is equal to $\lambda/4$, where $\lambda$ is the period of the interdigitated structure. Lastly, for a coaxial-cylinder capacitor, the characteristic distance d is the radial distance between the two cylinders.

The excitation electrodes 1, 2 may have different forms, such as planar forms, cylindrical forms, interdigitated forms, etc.

The pair of excitation electrodes 1, 2 is advantageously covered with a dielectric film 20. By way of non-limiting example, the dielectric film 20 may be made from a dielectric selected from a polyimide, a polytetrafluoroethylene, and a photosensitive resin.

By way of non-limiting example, the excitation electrodes 1, 2 may be made from a metal preferably selected from Cu, Ag, Au, and Al. However, the excitation electrodes 1, 2 may be made from a plastic (e.g., a polyphthalamide) into which carbon fibers have been incorporated in order to make the excitation electrodes 1, 2 electrically conductive.

Ground Plane

The device advantageously comprises:
a dielectric layer 10, comprising a first surface and an opposite second surface, the pair of excitation electrodes 1, 2 extending to the first surface of the dielectric layer 10; and
a counter-electrode, extending to the second surface of the dielectric layer 10, and forming the ground plane PM.

Such a dielectric layer 10 allows the excitation electrodes 1, 2 and the counter-electrode to be electrically insulated from each other so as to avoid short-circuiting them.

By way of non-limiting example, the counter-electrode may be a plate made from a metal. The metal is preferably selected from Cu, Ag, Au, and Al. However, the counter-electrode may be made from a plastic (e.g., a polyphthalamide) into which carbon fibers have been incorporated in order to make the counter-electrode electrically conductive.

By way of non-limiting example, the dielectric layer may be made from a dielectric selected from a polyimide and a polytetrafluoroethylene.

Electronic Circuit

Figure 1:
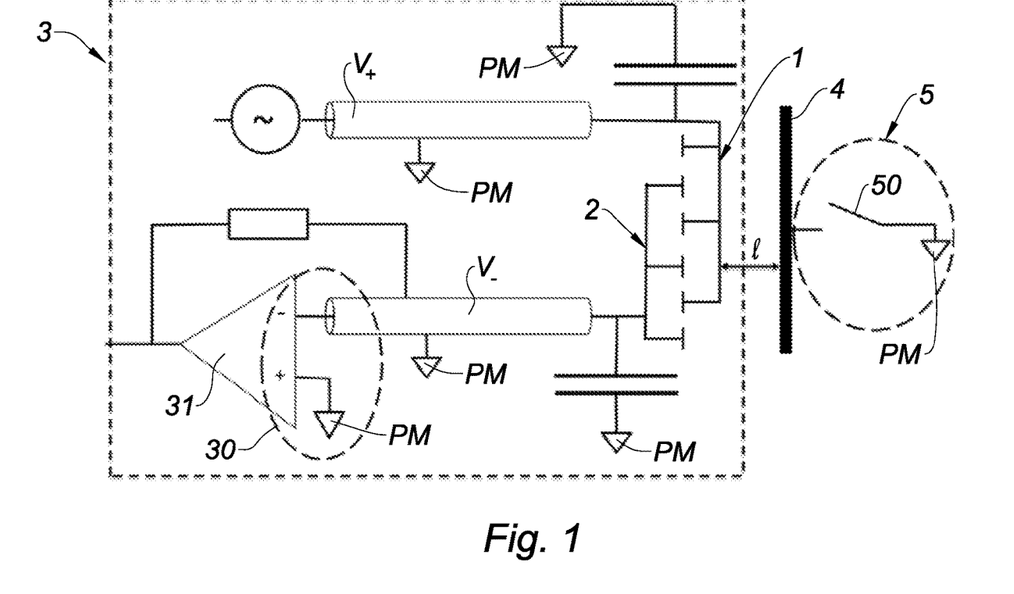
FIG. 1 is a schematic view illustrating the circuitry of a device according to the present disclosure.

The working frequency, at which the electronic circuit 3 applies an electrical potential V+, V− to each excitation electrode 1, 2, is chosen so as to be lower than or equal to the cut-off frequency of at least one of the phases $P_1, P_2, P_3$. As mentioned above, the working frequency may be set to 1 kHz to detect the presence of an aqueous phase $P_1$. As illustrated in FIG. 1, the electronic circuit 3 may comprise an excitation source (e.g., an AC voltage generator) for charging one excitation electrode 1 of the pair in order to apply thereto an electrical potential V+. The other excitation electrode 2 of the pair may be connected to the ground plane PM in order to apply thereto the electrical potential V.

The electronic circuit 3 advantageously comprises a virtual ground 30 connected to one excitation electrode 1, 2. The electronic circuit 3 is advantageously configured to measure the transcapacitance between the pair of excitation electrodes 1, 2 using a three- or four-wire method.

The electronic circuit 3 advantageously comprises an operational amplifier 31, which is used as an inverter and comprises:
a non-inverting input, connected to the ground plane PM; and
an inverting input, connected to an excitation electrode 2.

The operational amplifier 31 is employed in linear regime so as to place the excitation electrode 2 connected to the inverting input at ground potential virtually.

Control Electrode(s)

The distance at which is arranged the control electrode 4 of the capacitor, which distance is denoted l, is chosen so that:

$$0 < l < 100 \times d\frac{f_c}{f} \text{ and preferably so that}$$

$$0 < l < 10 \times d\frac{f_c}{f}$$

where:
$f_c$ is the cut-off frequency, and
f is the working frequency.

As illustrated in FIG. 4, the device advantageously comprises a set of control electrodes 4 that are arranged at different distances $I_1, I_2, I_3$ from the capacitor, and that are intended to be inserted into the multiphase medium M. Each of the different distances (denoted $I_i$) at which are arranged the control electrodes 4 of the set advantageously respects:

$$0 < l_i < 100 \times d\frac{f_c}{f} \text{ and preferably so that}$$

$$0 < l_i < 10 \times d\frac{f_c}{f}$$

As illustrated in FIG. 4, the control electrodes 4 of the set are spaced apart horizontally, this allowing the multiphase medium M to be studied in this dimension.

As illustrated in FIG. 5, the device may comprise a set of control electrodes 4, which electrodes are arranged at the same distance l from the one or more capacitors, and spaced apart vertically so as to be coplanar, this allowing the multiphase medium M to be studied in this dimension.

The control electrode 4 or the control electrodes 4 may take the form of a grid, or the form of meanders. In the case of a control electrode 4 taking the form of a grid, one advantageous effect thereof is to promote contact with the conductive phase of the multiphase medium M, whether the phase be distributed surfacewise or volumewise, for example when the conductive phase is a foam or an emulsion. In the case of a control electrode 4 taking the form of meanders, the electrode may advantageously be planar, and parallel to the interdigitated excitation electrodes 1, 2. The pitch of the meanders will possible be chosen so as to detect all or some of the conductive phase of the multiphase medium M, when the conductive phase is distributed alternately (for example, when droplets that are separate from one another wet a surface of the meanders) in order to allow the fraction of the conductive phase covering the meanders to be detected.

By way of non-limiting example, the control electrode 4 or the control electrodes 4 may be made from a metal, which is preferably selected from Cu, Ag, Au, and Al. However, the control electrode 4 or the control electrodes 4 may be made from a plastic (e.g., a polyphthalamide) into which carbon fibers have been incorporated in order to make the control electrodes 4 electrically conductive.

Switching Circuit

When the device comprises a set of control electrodes 4, the switching circuit 5 comprises one dedicated switch 50 for each control electrode 4.

By way of non-limiting example, the switch 50 may be an on/off switch or an electrical relay.

Application to Phase Detection

The device, according to the present disclosure, may be a detector of presence of one of the phases $P_1$, $P_2$, $P_3$ provided that there is a difference between the transcapacitance measured by the electronic circuit 3 between the pair of excitation electrodes 1, 2 when the switch 50 is in the open state (denoted $C_{off}$), and when the switch 50 is in the closed state (denoted $C_{on}$). The difference measured between $C_{off}$ and $C_{on}$ is indicative of the difference in dielectric response (in terms of electrical permittivity e) of the detected phase when the latter is excited by an electrical potential, whether the latter is an exterior potential or not.

In practice, a detection threshold will be defined for the difference between $C_{off}$ and $C_{on}$, above which threshold the presence of the phase is ensured.

Application to Phase Quantification

Let the following be considered:
a multiphase medium M containing three stratified phase $P_1$, $P_2$, $P_3$ that differ in their dielectric properties, and that have a height $h_1$, $h_2$, $h_3$ in a vessel R of height H, respectively; and
that the phase $P_1$ has a differentiated dielectric response in the presence of an exterior electrical potential.
Noting $x_1 = h_1/H$; $x_2 = h_2/H$; $x_3 = h_3/H$
it is possible to establish the following equations:

$$x_1 + x_2 + x_3 = 1$$

$$C_{off} = x_1 C_{1,off}^H + x_2 C_2^H + x_3 C_3^H$$

$$C_{on} = x_1 C_{1,on}^H + x_2 C_2^H + x_3 C_3^H$$

where:
$C_2^H$ and $C_3^H$ are the transcapacitances between the pair of excitation electrodes 1, 2 when the vessel R is filled with a phase $P_2$ and filled with a phase $P_3$, respectively, and
$C_{1,on}^H$ and $C_{1,off}^H$ are the transcapacitances between the pair of excitation electrodes 1, 2 when the vessel R is filled with a phase $P_1$, and when the switch 50 is in the closed state and in the open state, respectively.

It is then possible to obtain the following relationships:

$$x_1 = \frac{C_{on} - C_{off}}{C_{1,on}^H - C_{1,off}^H}$$

$$x_2 = \frac{((C_{off} - x_1 C_{1,off}^H) - C_3^H(1 - x_1))}{C_2^H - C_3^H}$$

$$x_3 = \frac{((C_{on} - x_1 C_{1,on}^H) - C_2^H(1 - x_1))}{C_3^H - C_2^H}$$

The value $x_1$ (and therefore $h_1$) is perfectly determined because:
$C_{on}$ and $C_{off}$ are values measured during the acquisition, and
$C_{1,on}^H$ and $C_{1,off}^H$ are values measured by prior calibration (see the following section).

In the same way, it is possible to determine $x_2$ (and therefore $h_2$) and $x_3$ (and therefore $h_3$) on the basis of the acquisition measurements and of the calibration measurements.

Calibration of the Device

If the device is to be used for phase quantification, it is necessary to calibrate the device beforehand in order to determine the values of $C_{1,on}^H$, $C_{1,off}^H$, $C_2H$, $C_3^H$.

These calibrations may also be performed based on two other conditions of known levels, or by similarity with another medium, or even by numerical simulation.

It is possible to calibrate the device in-situ, using additional capacitive sensors (compensating capacitors) and techniques known to those skilled in the art.

Installation

One subject of the present disclosure is an installation, comprising:
a vessel R containing a multiphase medium M; and
a device according to the present disclosure, the control electrode 4 being inserted into the multiphase medium M.

The term "vessel" has a broad meaning and covers any means allowing the multiphase medium M to be contained.

The vessel R is advantageously electrically insulated from the multiphase medium M in order not to apply electrical potential to the control electrode 4 (left floating by the switch 50 in the open state). The electrical potential thus remains set by the multiphase medium M when the switch 50 is in the open state. When the vessel R is not electrically insulated from the multiphase medium M (e.g., a vessel R with metal walls), then the capacitor and the control electrode 4 are arranged at a sufficiently large distance from the metal walls of the vessel R so that the vessel R does not influence the electrical potential of the multiphase medium M.

The pair of excitation electrodes 1, 2 may be inserted into the multiphase medium M. By way of variant, the pair of excitation electrodes 1, 2 may be placed on the exterior side of a dielectric wall serving to contain the multiphase medium M.

Examples of Embodiments

Figure 7:
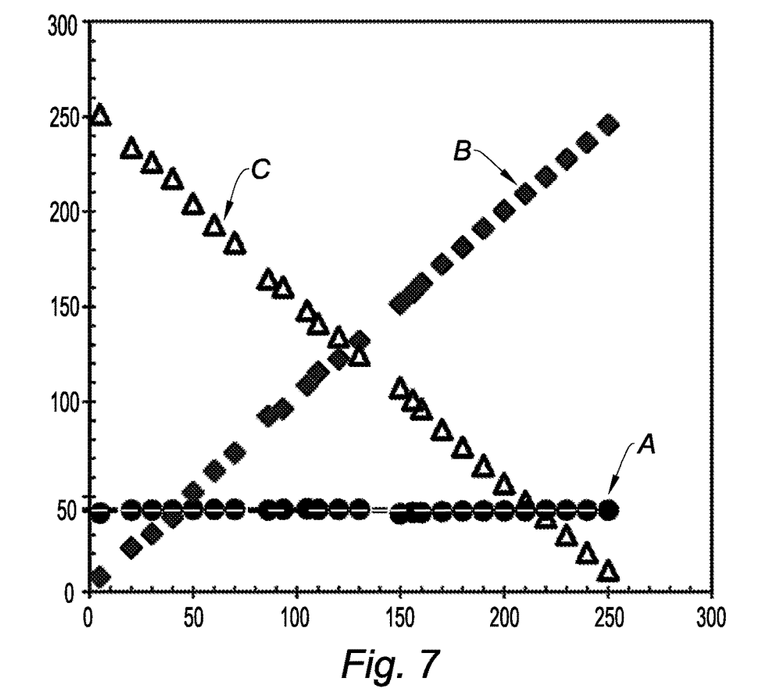
FIG. 7 is a graph, the x-axis of which represents the observed oil level (in mm) and the y-axis of which represents the phase level (in mm) determined from the capacitive measurements of a device according to the present disclosure. "A" is an aqueous phase, "B" is an oil phase, and "C" is an air phase.
Figure 8:
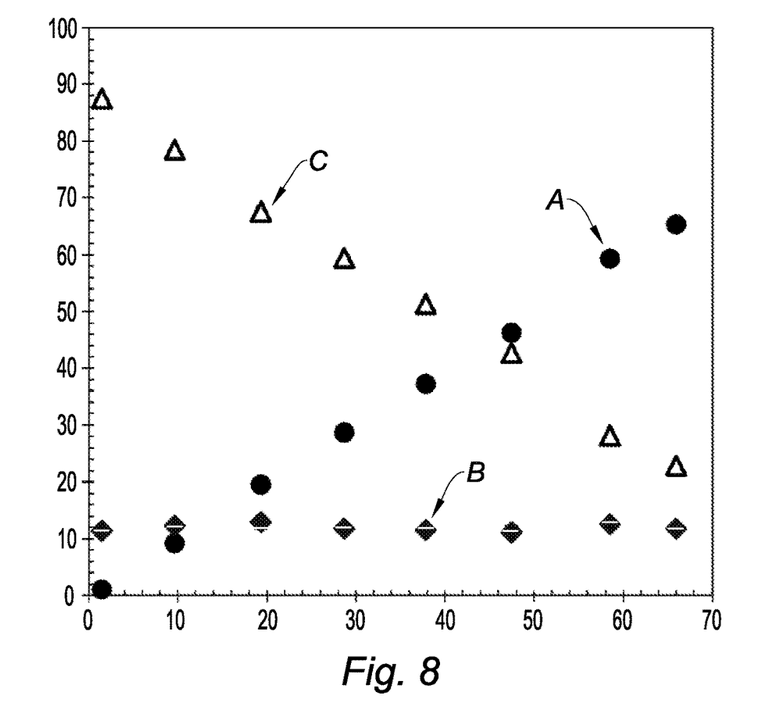
FIG. 8 is a graph, the x-axis of which represents the observed water level (in % of the total height of the multiphase medium) and the y-axis of which represents the phase level (in % of the total height of the multiphase medium) determined from the capacitive measurements of a device according to the present disclosure. "A" is an aqueous phase, "B" is an oil phase, and "C" is an air phase.

As illustrated in FIGS. 7 and 8, tests were performed on a multiphase medium M containing an aqueous phase A, an oil phase B and an air phase C in a vessel R consisting of a test-tube of a height H.

The capacitor was formed by a pair of interdigitated excitation electrodes 1, 2. Each excitation electrode 1, 2 had a width of 250 µm. The inter-electrode distance was 250 µm. The capacitor had a height of 300 mm. The capacitor extended over one face of a dielectric layer 10 made of polyimide. The dielectric layer 10 had a thickness of 25 µm. The pair of excitation electrodes 1, 2 was covered with a dielectric film 20 made of polyimide. The dielectric film 20 had a thickness of 25 µm.

The working frequency was 1 kHz. The transcapacitance between the pairs of excitation electrodes 1, 2 was measured using an LCR meter.

The calibration to determine the values $C_{A,on}^H$, $C_{A,off}^H$ was carried out by filling a test-tube with water and by submerging the pair of excitation electrodes 1, 2 and the control electrode 4 in the test-tube. The same protocol was observed for the oil.

In the case illustrated in FIG. 7, oil was gradually poured into a test-tube that initially contained only water. In the case illustrated in FIG. 8, water was gradually poured into a test-tube that initially contained only oil. In both cases it was observed that the fluid-level values determined on the basis of the capacitive measurement of the device, according to the present disclosure, coincided with the fluid levels observed by eye.

System for Taking Measurements with a Floating Device

As illustrated in FIGS. 9a to 9e, one subject of the present disclosure is a system for taking capacitive measurements in a multiphase medium M, comprising:
- a floating device 6, intended to float in the multiphase medium M; and
- at least one device 7 according to the present disclosure, which device is securely fastened to the floating device 6.

Figure 9A:
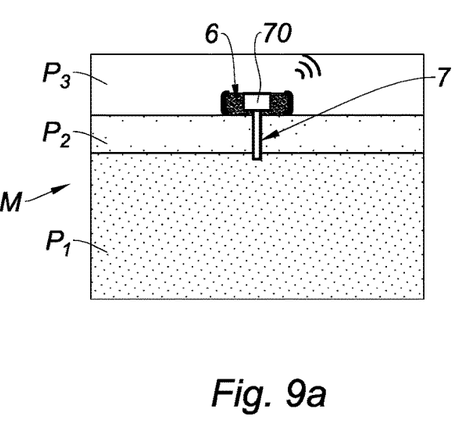
FIGS. 9a to 9e are schematic cross-sectional views, illustrating various embodiments of such a system according to the present disclosure.
Figure 9B:
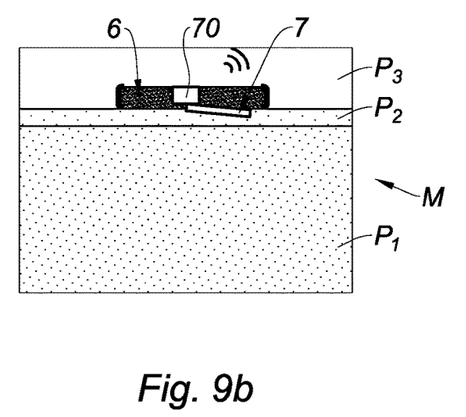
Figure 9C:
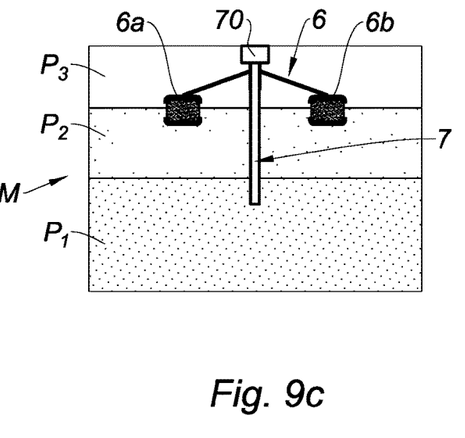
Figure 9D:
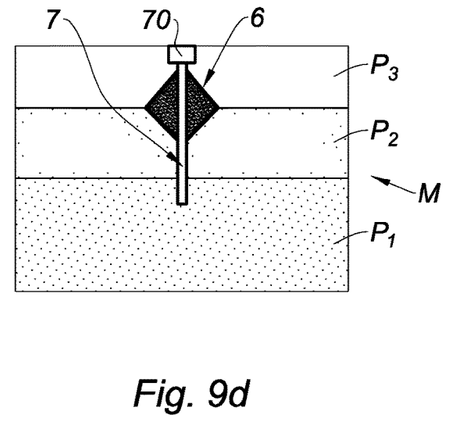
Figure 9E:
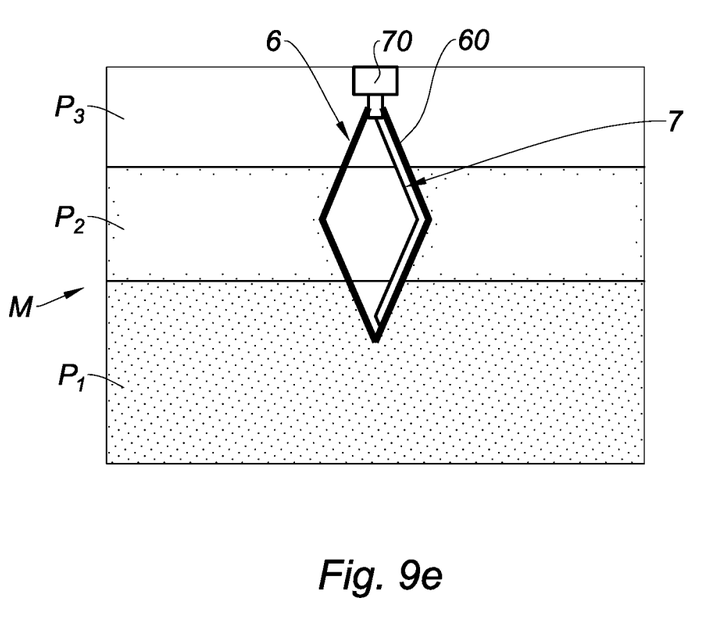

As illustrated in FIG. 9e, the floating device 6 may comprise a separating wall 60 forming a barrier to the multiphase medium M, the wall 60 possessing an internal surface, and the device 7 for taking capacitive measurements is mounted inside the wall 60, against the internal surface.

The multiphase medium M may comprise three stratified phases comprising, in succession:
- a liquid first phase $P_1$, which is electrically conductive at the working frequency;
- a liquid second phase $P_2$, which is liable to contain one or more pollutants such as oils or hydrocarbons, and which is dielectric at the working frequency; and
- a gaseous third phase $P_3$, which is dielectric at the working frequency.

The floating device 6 is arranged to float on the surface of the liquid second phase $P_2$. The floating device 6 may be a buoy. The floating device 6 may comprise a number of floats 6a, 6b. The floating device 6 may be of conical shape.

Of course, the electronic circuit 3 and the switching circuit 5 of the device 7 for taking capacitive measurements are seal-tight with respect to the multiphase medium M. The device 7 for taking capacitive measurements advantageously comprises a module 70 configured to transmit the height of the liquid second phase $P_2$, the transmission possibly being performed via a wireless communication. The device 7 for taking capacitive measurements is advantageously powered electrically:
- by a battery, or
- by a system for harvesting energy from the movement or variations in temperature of the floating device 6, or
- by a power source connected to a solar collector, in order to make the operation of the device 7 for taking capacitive measurements autonomous.

For an application for limiting the height of the liquid second phase $P_2$, as illustrated in FIGS. 9a, 9c and 9d, the excitation electrodes 1, 2 and the one or more control electrodes 4 of the device 7 for taking capacitive measurements may be arranged to extend vertically, in contact with the liquid first and second phases $P_1$, $P_2$, and to a depth slightly larger than the height of the liquid second phase $P_2$.

For an application for detecting pollutants, as illustrated in FIG. 9b, the excitation electrodes 1, 2 and the one or more control electrodes 4 of the device 7 for taking capacitive measurements are advantageously arranged to lie entirely in the liquid second phase $P_2$, preferably substantially parallel to the free surface of the liquid second phase $P_2$.

The invention is not limited to the described embodiments. Those skilled in the art will be able to consider technically workable combinations thereof, and to substitute equivalents therefor.

The invention claimed is:

1. A device for taking capacitive measurements in a multiphase medium, comprising:
   at least one pair of excitation electrodes, forming a capacitor;
   a ground plane; and
   an electronic circuit, arranged to electrically connect the pair of excitation electrodes to the ground plane, and configured to:
      apply an electrical potential ($V_+$, $V_-$) to each excitation electrode at a working frequency, and
      measure a transcapacitance between the pair of excitation electrodes;
   wherein the device also comprises:
      at least one control electrode, arranged at a distance from the capacitor, and intended to be inserted into the multiphase medium; and
      a switching circuit comprising a switch having an open state and a closed state, in which states the switch electrically disconnects and connects the control electrode from/to the ground plane, respectively, the switching circuit being configured to:
         apply, to the control electrode, an electrical potential common to the ground plane, when the switch is in the closed state, and
         leave the electrical potential of the control electrode floating, when the switch is in the open state; and
      wherein the electronic circuit is configured to measure the transcapacitance between the pair of excitation electrodes when the switch is in the open state and when the switch is in the closed state.

2. The device of claim 1, wherein:
   the multiphase medium comprises a phase containing species that are electrically conductive at the working frequency; the species possessing a cut-off frequency, below which the species equalize the electrical potential, left floating, in the multiphase medium, over the distance at which is arranged the control electrode of the capacitor; and
   the working frequency is chosen so as to be lower than or equal to the cut-off frequency.

3. The device of claim 2, wherein:
   the capacitor has a characteristic distance; and
   the distance at which is arranged the control electrode of the capacitor is chosen so that:

$$0 < l < 100 \times d \frac{f_c}{f} \text{ and preferably so that}$$

$$0 < l < 10 \times d \frac{f_c}{f}$$

where:
   l is the characteristic distance of the capacitor,
   d is the distance at which is arranged the control electrode of the capacitor,
   $f_c$ is the cut-off frequency, and
   f is the working frequency.

4. The device of claim 1, further comprising a set of control electrodes, of the at least one control electrode, the control electrodes of the set being arranged at various distances from the capacitor and being intended to be inserted into the multiphase medium, the switching circuit comprising one dedicated switch for each of the control electrodes.

5. The device of claim 1, wherein:
   the electronic circuit comprises a virtual ground connected to one excitation electrode of the pair of excitation electrodes, and wherein the electronic circuit is configured to measure the transcapacitance between the pair of excitation electrodes using a three- or four-wire method.

6. The device of claim 5, wherein the electronic circuit further comprises an operational amplifier used as an inverter, the operational amplifier comprising:
   a non-inverting input, connected to the ground plane; and
   an inverting input, connected to one excitation electrode of the pair of excitation electrodes.

7. The device of claim 1, further comprising:
   a dielectric layer, comprising a first surface and an opposite second surface, the pair of excitation electrodes extending to the first surface of the dielectric layer; and
   a counter-electrode, extending to the second surface of the dielectric layer, and forming the ground plane.

8. The device of claim 1, wherein the pair of excitation electrodes is covered with a dielectric film.

9. The device of claim 1, wherein the capacitor formed by the at least one pair of excitation electrodes is selected from a parallel-plate capacitor, a capacitor with interdigitated electrodes, and a coaxial-cylinder capacitor.

10. An installation, comprising:
    the device of claim 1; and
    a vessel containing the multiphase medium of claim 1, the control electrode of the device being inserted into the multiphase medium.

11. A system for taking capacitive measurements in the multiphase medium of claim 1, comprising:
    a floating device, intended to float in the multiphase medium; and
    at least one of the device of claim 1, securely fastened to the floating device.

12. The system of claim 11, wherein:
    the floating device comprises a separating wall forming a barrier to the multiphase medium, the wall possessing an internal surface, and
    the device of claim 1 is mounted inside the wall, against the internal surface.

* * * * *